(12) United States Patent
Kim (10) Patent No.: US 8,031,502 B2
(45) Date of Patent: Oct. 4, 2011

(54) HYBRID CONTENT ADDRESSABLE MEMORY

(75) Inventor: Jin-Ki Kim, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 145 days.

(21) Appl. No.: 12/421,112

(22) Filed: Apr. 9, 2009

(65) Prior Publication Data

US 2009/0190386 A1 Jul. 30, 2009

Related U.S. Application Data

(63) Continuation of application No. 10/809,421, filed on Mar. 26, 2004, now abandoned.

(51) Int. Cl.
*G11C 15/00* (2006.01)
*G11C 15/04* (2006.01)

(52) U.S. Cl. ............... 365/49.16; 365/49.1; 365/49.11; 365/49.12; 365/49.17

(58) Field of Classification Search .......... 365/49.1, 365/49.11, 49.12, 49.16, 49.17, 203, 230.03
See application file for complete search history.

(56) References Cited

U.S. PATENT DOCUMENTS

| | | | |
|---|---|---|---|
| 4,377,855 A * | 3/1983 | Lavi | ............................ 365/49.17 |
| 5,440,715 A | 8/1995 | Wyland et al. | |
| 5,471,189 A | 11/1995 | Dietz et al. | |
| 5,841,874 A | 11/1998 | Kempke et al. | |
| 6,012,131 A | 1/2000 | Kang | |
| 6,108,227 A | 8/2000 | Voelkel | |
| 6,157,558 A | 12/2000 | Wong et al. | |
| 6,169,685 B1 | 1/2001 | Gandini et al. | |
| 6,191,970 B1 | 2/2001 | Pereira | |
| 6,243,280 B1 | 6/2001 | Wong | |
| 6,252,789 B1 | 6/2001 | Pereira et al. | |
| 6,362,992 B1 | 3/2002 | Cheng | |
| 6,373,739 B1 | 4/2002 | Lien et al. | |
| 6,381,673 B1 | 4/2002 | Srinivasan et al. | |
| 6,421,265 B1 | 7/2002 | Lien et al. | |
| 6,473,846 B1 | 10/2002 | Melchior | |
| 6,480,406 B1 | 11/2002 | Jin et al. | |
| 6,499,081 B1 | 12/2002 | Nataraj et al. | |
| 6,522,596 B2 | 2/2003 | Gillingham et al. | |
| 6,584,003 B1 | 6/2003 | Kim et al. | |
| 6,665,202 B2 | 12/2003 | Lindahl et al. | |
| 6,697,276 B1 | 2/2004 | Pereira et al. | |
| 6,704,216 B1 | 3/2004 | Cheng et al. | |
| 6,707,692 B2 | 3/2004 | Hata | |
| 6,708,250 B2 | 3/2004 | Gillingham | |
| 6,717,876 B2 | 4/2004 | Vlasenko et al. | |
| 6,768,659 B2 | 7/2004 | Gillingham et al. | |

(Continued)

*Primary Examiner* — J. H. Hur
(74) *Attorney, Agent, or Firm* — Shin Hung; Borden Ladner Gervais LLP (57) ABSTRACT

A CAM device memory array having different types of memory cells. A CAM device memory array is subdivided into at least two different portions, where each portion uses only one particular type of CAM cell, and each portion is dedicated to storing a particular type of data. In particular, at least one portion consists of binary CAM cells and the other portion consists of ternary CAM cells. The portions can be partitioned along the row, or matchline, direction or along the bitline direction. Since particular data formats only require predefined bit positions of a word of data to be ternary in value, the remaining binary bit positions can be stored in binary CAM cells. Therefore, the CAM device memory array will occupy an overall area that is less than memory arrays of the same density consisting exclusively of ternary CAM cells.

15 Claims, 10 Drawing Sheets

U.S. PATENT DOCUMENTS

| | | |
|---|---|---|
| 6,839,256 B1 * | 1/2005 | Proebsting et al. ........ 365/49.15 |
| 6,967,856 B1 | 11/2005 | Park et al. |
| 7,136,961 B2 | 11/2006 | Roth |
| 7,191,280 B2 | 3/2007 | Aadsen et al. |
| 2002/0015348 A1 * | 2/2002 | Gillingham et al. .......... 365/227 |
| 2002/0042865 A1 * | 4/2002 | McKenzie et al. ............ 711/158 |

* cited by examiner

HYBRID CONTENT ADDRESSABLE MEMORY

CROSS-REFERENCE TO RELATED APPLICATIONS

This application is a continuation of U.S. patent application Ser. No. 10/809,421, filed Mar. 26, 2004, the contents of which are expressly incorporated herein by reference in their entirety.

FIELD OF THE INVENTION

The present invention relates generally to content addressable memories. More particularly, the present invention relates to content addressable memory array architectures.

BACKGROUND OF THE INVENTION

An associative memory system called Content Addressable Memory (CAM) has been developed to permit its memory cells to be referenced by their contents. Thus CAM has found use in lookup table implementations such as cache memory subsystems and is now rapidly finding use in networking system applications such as network address translation, pattern recognition, and data compression. CAM's most valuable feature is its ability to perform a search and compare of multiple locations as a single operation, in which search data is compared with data stored within the CAM. Typically search data is loaded onto search lines and compared with stored words in the CAM. During a search-and-compare operation, a match or mismatch signal associated with each stored word is generated on a matchline, indicating whether the search word matches a stored word or not.

A CAM stores data in a matrix of cells, which are typically SRAM based cells. However, to provide ternary state CAMs, ie. where each CAM cell can store one of three values: a logic "0", "1" or "don't care" result, ternary SRAM based cells require two binary SRAM cells.

Figure 1:
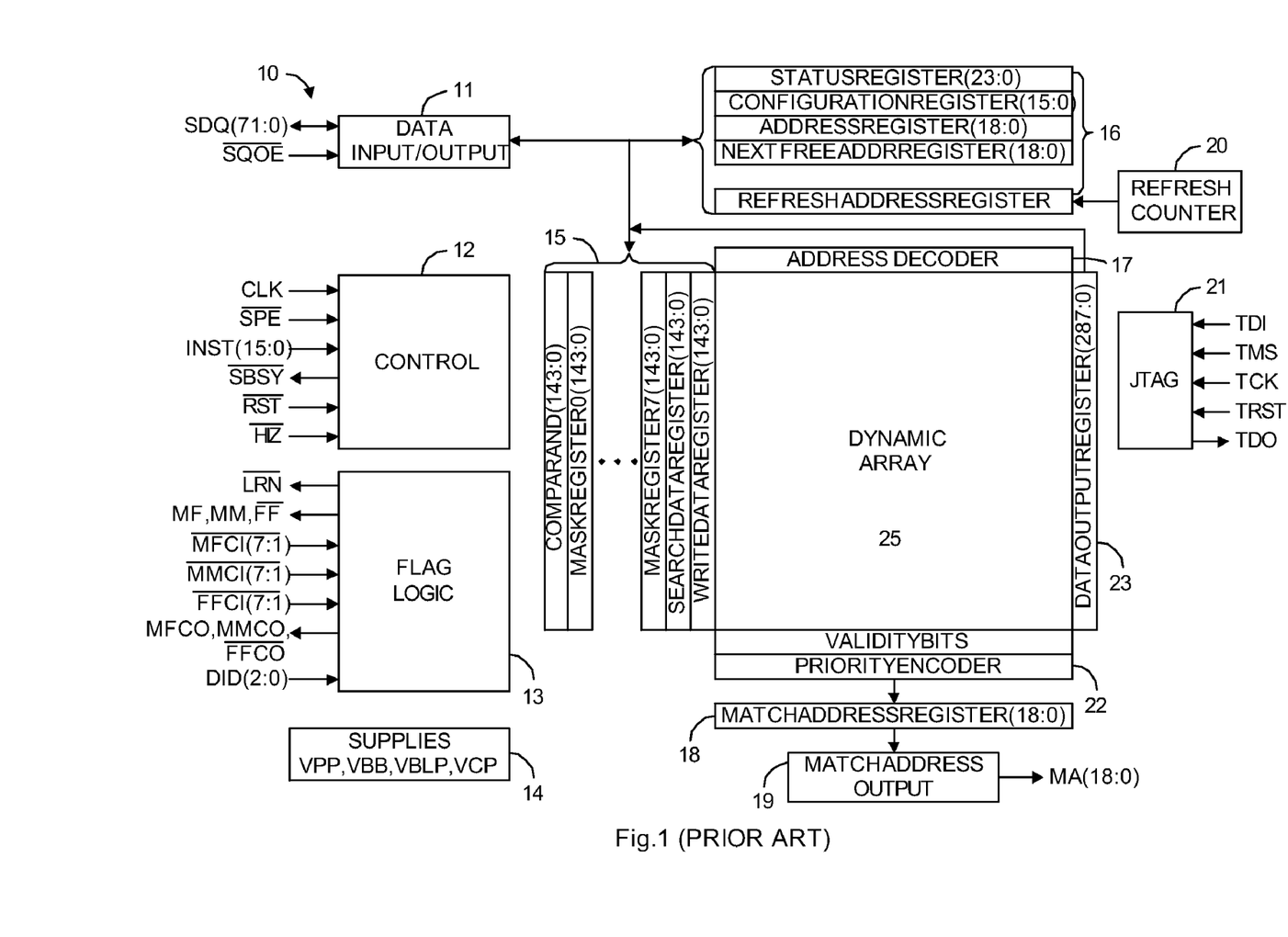
FIG. 1 is a block diagram of a typical DRAM based CAM chip.

A typical CAM block diagram is shown in FIG. 1. The CAM 10 includes a matrix, or CAM memory array 25, of CAM cells (not shown) arranged in rows and columns. A predetermined number of CAM cells in a row store a word of data. An address decoder 17 is used to select any row within the CAM array 25 to allow data to be written into or read out of the selected row. Data access circuitry such as bitlines and column selection devices, are located within the array 25 to transfer data into and out of the array 25. Located within CAM array 25 for each row of CAM cells are matchline sense circuits, which are not shown, and are used during search-and-compare operations for outputting a result indicating a successful or unsuccessful match of a search word against the stored word in the row. The results for all rows are processed by the priority encoder 22 to output the address (Match Address) corresponding to the location of a matched word. The match address is stored in match address registers 18 before being output by the match address output block 19. Data is written into array 25 through the data I/O block 11 and the various data registers 15. Data is read out from the array 25 through the data output register 23 and the data I/O block 11. Other components of the CAM include the control circuit block 12, the flag logic block 13, the voltage supply generation block 14, various control and address registers 16, and JTAG block 21.

Figure 2:
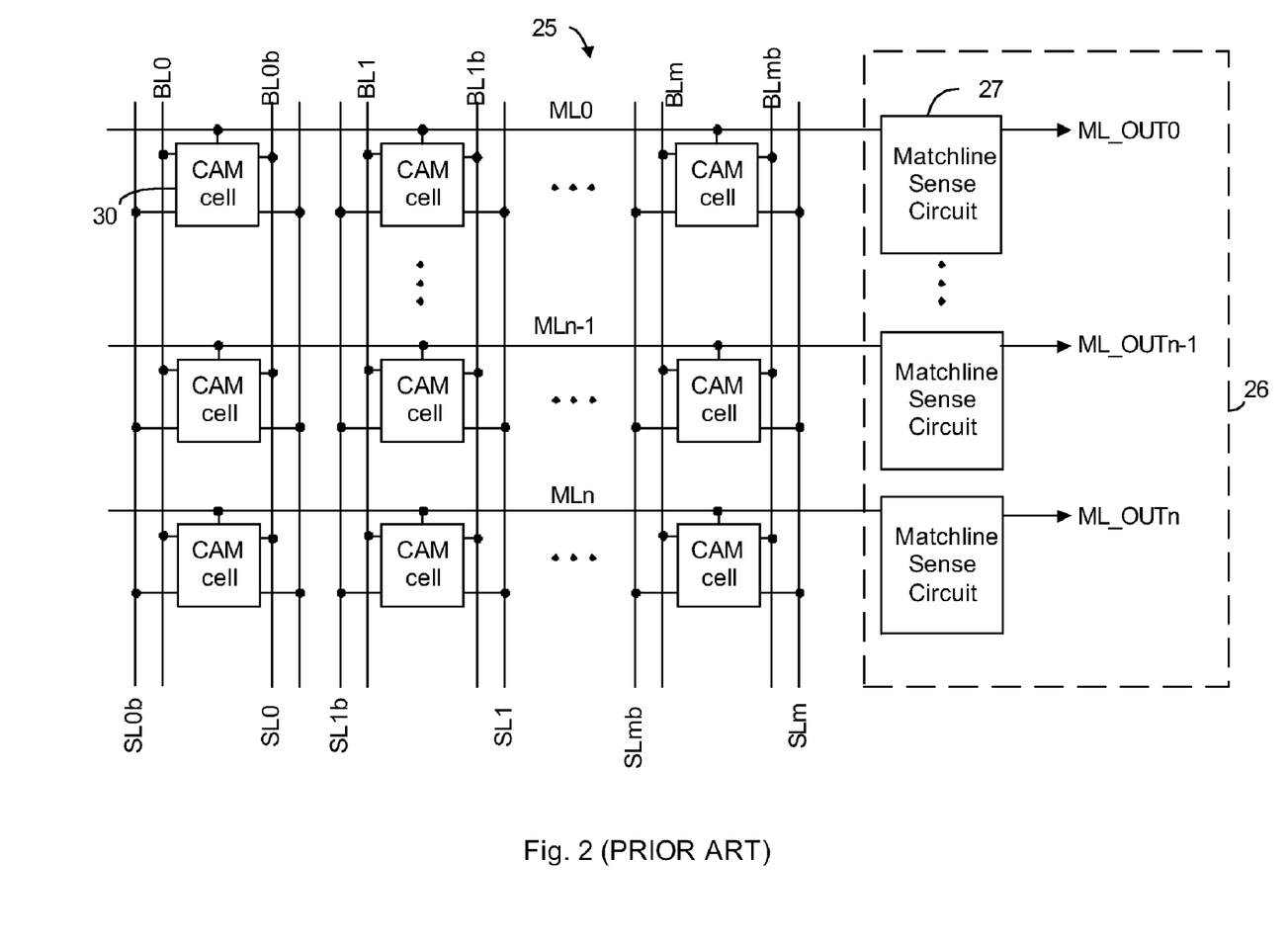
FIG. 2 is a circuit schematic of the memory array of FIG. 1.

FIG. 2 depicts a hierarchical view of the typical CAM array 25. CAM array 25 includes a matrix of CAM cells 30 and a matchline sense circuit block 26. CAM cells 30 of the CAM array 25 are arranged in rows and columns. CAM cells 30 of a row are connected to a common matchline MLi, and CAM cells 30 of a column are connected to a common pair of search lines SLjb/SLj and a common pair of bitlines BLj/BLjb, where i is an integer value between 0 and n, and j is an integer value between 0 and m. While not shown to simplify the schematic, each row of CAM cells 30 is connected to a wordline, and those of skill in the art will understand that wordlines are required to ensure operability of the CAM cells 30. Located adjacent to the CAM array 25 for each row is matchline sense circuit block 26. Matchline sense circuit block 26 includes one matchline sense circuit 27 connected to a respective matchline MLi, and is used during search-and-compare operations for outputting match signals ML_OUT0-ML_OUTn which indicate a successful or unsuccessful match of a search word against the stored word. Although not shown in the simplified schematic of FIG. 2, the matchline sense circuits 27 also receive control signals to control their operation, and a person skilled in the art would understand that such control signals to be necessary for their proper operation of the circuit. While the bitlines are connected to well known bitline circuits, the searchlines in a CAM device 10 are connected to searchline drivers (not shown), such as those disclosed in commonly owned U.S. Pat. No. 6,522,596.

Figure 3:
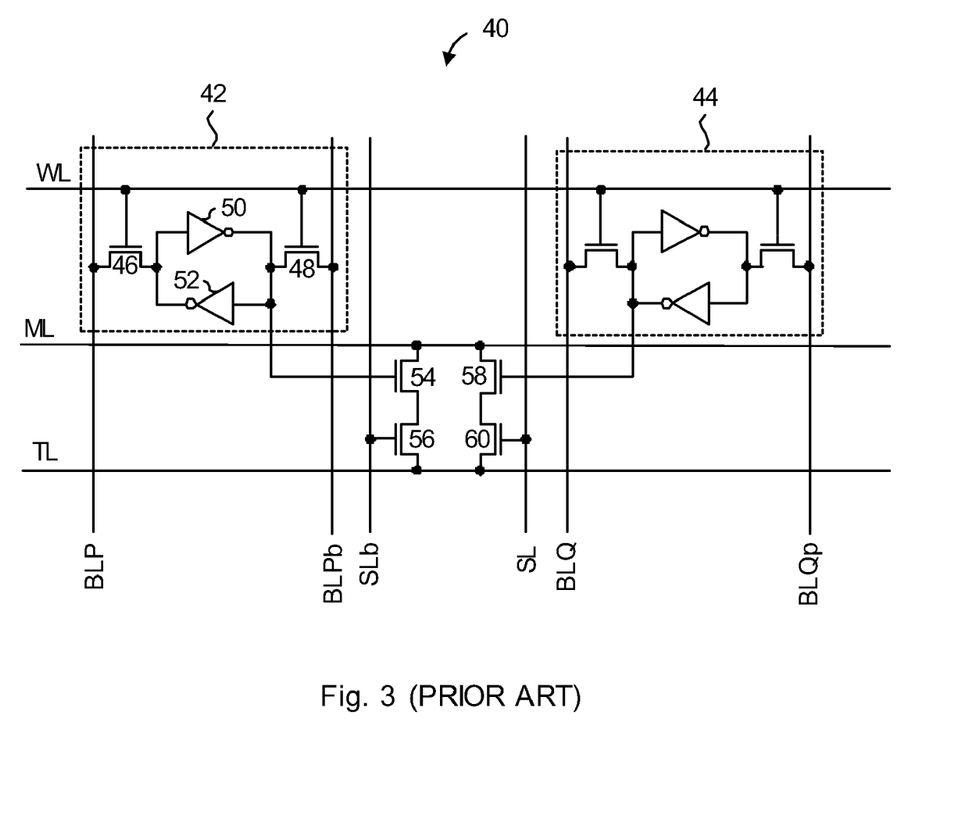
FIG. 3 is a circuit schematic of an SRAM based ternary CAM cell.
Figure 4:
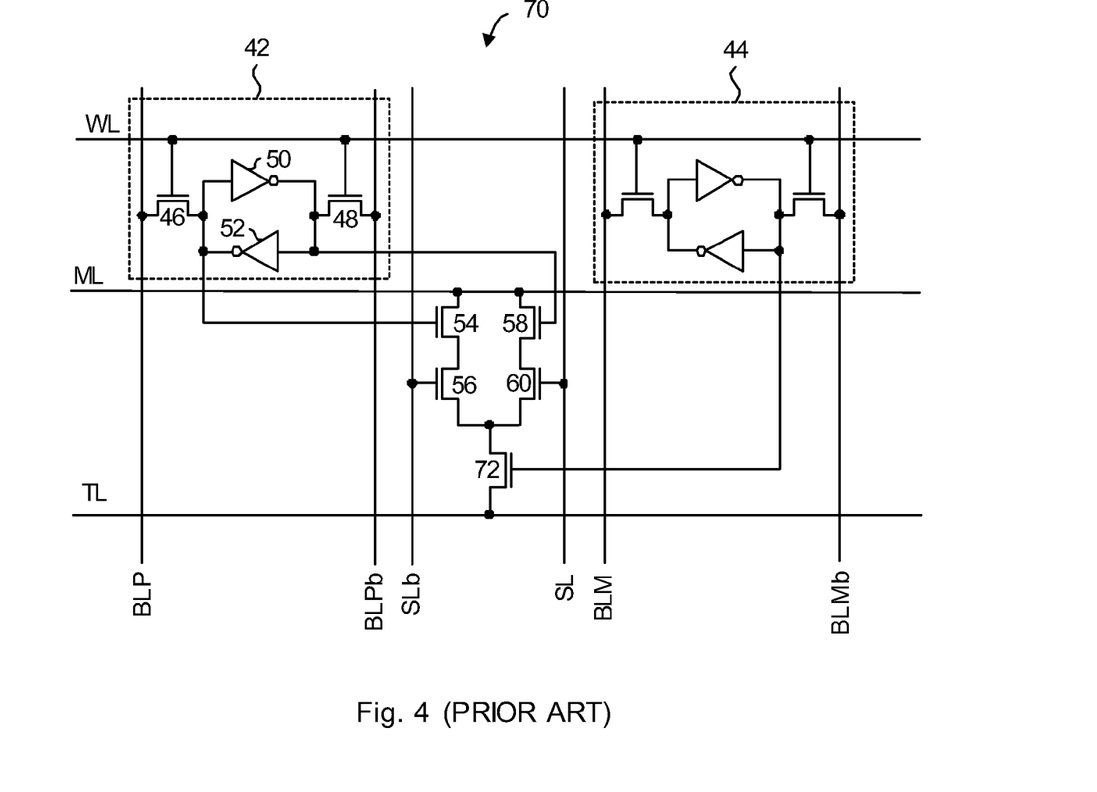
FIG. 4 is a circuit schematic of an alternate SRAM based ternary CAM cell.
Figure 5:
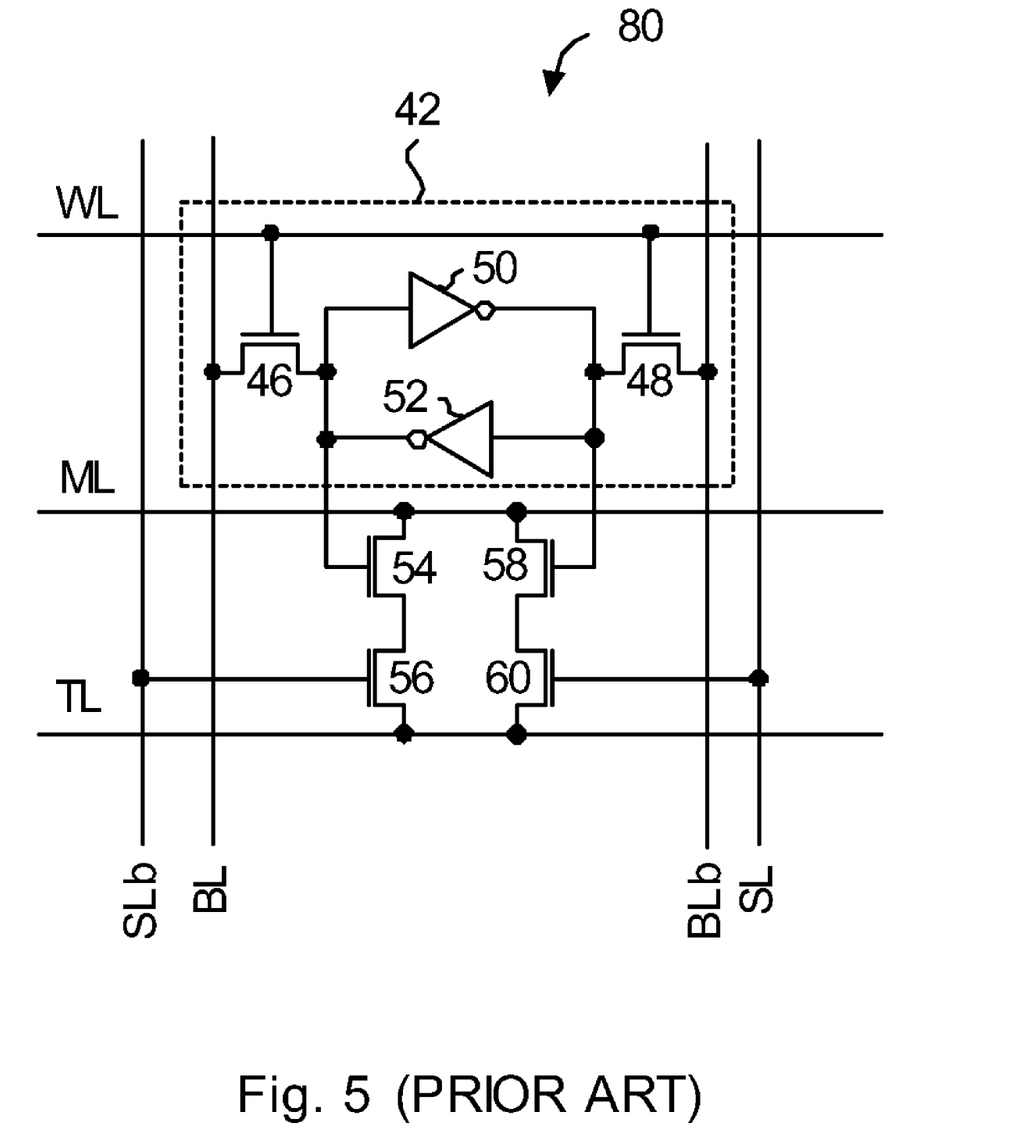
FIG. 5 is a circuit schematic of an SRAM based binary CAM cell.

FIGS. 3 through 5 show circuit schematics of the types of CAM cells 30 that can be used in the CAM array 25 of FIG. 2. FIG. 3 shows a typical ternary data SRAM type CAM cell, FIG. 4 shows an alternate ternary SRAM type CAM cell, and FIG. 5 shows a binary SRAM type CAM cell.

FIG. 3 shows a typical ternary SRAM type CAM cell, referred to as a ternary SCAM cell from this point forward. SCAM cell 40 includes two well-known six-transistor SRAM cells 42 and 44, and a pair of search and compare stacks. Since both SRAM cells 42 and 44 are identical to each other, the following description of SRAM cell 42 will apply to SRAM cell 44. SRAM cell 42 includes a first access transistor 46 and a second access transistor 48 for coupling bitlines BLP and BLPb respectively, to the complementary nodes of cross coupled inverters 50 and 52 in response to an active WL signal. The first search and compare stack associated with SCAM cell 42 includes compare transistor 54 and search transistor 56 serially connected between the matchline ML and the tail-line TL. The gate terminal of compare transistor 54 is connected to a node of SRAM cell 42 while the gate terminal of search transistor 56 is connected to searchline SLb. Tail-line TL is typically coupled to a ground, or VSS power supply. The second search and compare stack associated with SRAM cell 44 includes compare transistor 58 and search transistor 60 serially connected between the matchline ML and the tail-line TL. The gate terminal of compare transistor 58 is connected to a node of SRAM cell 44 while the gate terminal of search transistor 60 is connected to searchline SL.

SCAM cell 40 includes a total of 16 transistors and stores encoded ternary data. Together, the two SRAM cells of SCAM cell 40 can store a ternary value representing logic "1", logic "0", or "don't care". Table 1 below shows an example of the ternary data encoding. Persons of skill in the art should understand that SCAM cell 40 can be implemented with n-channel transistors as shown in FIG. 3, and/or p-channel transistors.

TABLE 1

| Ternary Value | SRAM Cell 42 | SRAM Cell 44 |
|---|---|---|
| 0 | 0 | 1 |
| 1 | 1 | 0 |
| "Don't Care" | 0 | 0 |

FIG. 4 shows an alternate type of ternary SCAM cell similar to the one shown in FIG. 3. The presently shown ternary SCAM cell stores one bit of data and one mask bit of data to block the search and compare results from affecting the matchline ML. SCAM cell 70 includes the previously described SRAM cells 42 and 44, and the search and compare stacks consisting of transistors 54, 56, 58 and 60. However, this SCAM cell 70 includes an additional mask transistor 72, and the gate terminal of compare transistor 58 is now connected to a storage node of SRAM cell 42 that is complementary to the storage node connected to the gate of compare transistor 54. Mask transistor 72 is connected between the source terminals of search transistors 56 and 60 and the tail line TL, and has its gate terminal connected to a storage node of SRAM cell 44. Accordingly, SCAM cell 70 consists of 17 transistors, implemented in n-channel and/or p-channel technology. SCAM cell 70 essentially functions as a searchable binary CAM cell with masking capability. More specifically, the comparison circuit is enabled if the mask bit stores a logic "0" and the comparison circuit is disabled if the mask bit stores a logic "1".

In applications where the mask bit is unnecessary, or where the data to be stored is only binary in nature, a typical binary SCAM cell can be used.

FIG. 5 is a circuit schematic of a typical binary SCAM cell. Binary SCAM cell 80 uses the same SRAM cell 42 and search and compare stacks as seen in the previous ternary SCAM cell schematics, and includes a total of 10 transistors which can be implemented in n-channel and/or p-channel technology. Clearly, the absence of the second SRAM cell 44 and mask transistor 72 makes binary SCAM cell 80 smaller than previously shown ternary SCAM cells 40 and 70.

As previously mentioned, binary based CAM, and in particular binary SCAM, has found wide use in networking applications where data packets are transferred through the network according to the data in the header portion of the data packet. More specifically, network data packet routing and switching operations involve matching the header portion of the data packet with predetermined comparand data. While binary CAM can be used to match header data, it is limited to searching for exact matches between the comparand data and the header data having the same bit length headers. Therefore, binary CAM is not practical for use in systems that receive data packets having variable bit length headers.

However, the additional "don't care" state provided by ternary CAM permits partial match searches to be executed as the irrelevant bit positions can be set to the "don't care" state such that no comparison to the corresponding bit of comparand data occurs. This capability is useful in modern network longest prefix matching operations, where only leading bits of the header portion are relevant for routing and switching.

Present ternary CAM chips are available in a 9M-bit density, meaning that the chip has approximately 9 million ternary CAM cells in its memory array arranged in rows and columns. A typical data packet can include a word of 144 bits stored by 144 ternary CAM cells in a row, or multiple 144-bit words stored in consecutive rows memory cells. With ternary data storage capability in each ternary CAM cell, the CAM chip can be used as a universal device for accommodating any data packet format because any number of ternary CAM cells can be reserved for header data.

However, it can be observed from progressive standardization of communication protocols and data packet formats that a specific number of bits of each data packet will only ever store binary data. Use of ternary CAM cells for storing only binary data is an inefficient use of silicon area because the unused storage cell of the ternary CAM cell cannot be used to store an unrelated bit of data, and use of ternary search circuits for performing binary searches unnecessarily wastes power.

Various schemes have been proposed in which ternary CAM cells can be dynamically configurable as binary CAM cells, such that the second data bit storage location of the ternary CAM cell can be used for storing another bit of data. Accordingly, the storage density of the CAM device memory array is effectively doubled. Unfortunately, such schemes require relatively complex CAM cell configurations which will further increase the size of the ternary CAM device memory array, and circuit overhead for controlling the operating mode of the configurable memory cells.

It is, therefore, desirable to provide a hybrid binary/ternary CAM device memory array that occupies minimal silicon area and consumes less power, while maintaining or improving CAM search and compare performance.

SUMMARY OF THE INVENTION

It is an object of the present invention to obviate or mitigate at least one disadvantage of previous CAM device memory array architectures. In particular, it is an object of the present invention to minimize the size of the CAM device memory array that can efficiently store both binary and ternary data.

In a first aspect, the present invention provides a hybrid content addressable memory array. The hybrid content addressable memory array includes a first memory portion having a first type of content addressable memory cells arranged in rows and columns, and a second memory portion having a second type of content addressable memory cells arranged in rows and columns, where the second type of content addressable memory cells being electrically coupled to the first type of content addressable memory cells.

In an embodiment of the first aspect, the first memory portion and the second memory portion include matchlines, where each matchline of the first memory portion is coupled to the first type of content addressable memory cells, and each matchline of the second memory portion is coupled to the second type of content addressable memory cells. According to an aspect of the present embodiment, the first type of content addressable memory cells include ternary content addressable memory cells and the second type of content addressable memory cells include binary content addressable memory cells, and the matchlines of the first memory portion and the matchlines of the second memory portion are interleaved with each other.

According to further embodiments of the first aspect, the first type of content addressable memory cells can include binary content addressable memory cells, the second type of content addressable memory cells can include ternary content addressable memory cells, the first and the second type of content addressable memory cells include SRAM based binary content addressable memory cells and SRAM based ternary content addressable memory cells, and at least one of the first and the second type of content addressable memory cells include configurable ternary-binary content addressable memory cells.

According to another embodiment of the first aspect, the first type of content addressable memory cells and the second type of content addressable memory cells of a row are coupled to a logical matchline, where the logical matchline can include a segmented matchline having a first matchline segment and a second matchline segment. The first type of content addressable memory cells can be coupled to the first matchline segment and the second type of content addressable memory cells can be coupled to the second matchline segment. Alternatively, the first type of content addressable memory cells and the second type of content addressable memory cells of a column can be coupled to common searchlines.

In a second aspect, the present invention provides a hybrid content addressable memory array having a first type of content addressable memory cells coupled to a logical matchline, and a second type of content addressable memory cells coupled to the logical matchline. The first type of content addressable memory cells can include binary content addressable memory cells and the second type of content addressable memory cells can include ternary content addressable memory cells, where the content addressable memory cells can be SRAM based.

According to an embodiment of the present aspect, the logical matchline includes a segmented matchline having at least two matchline segments, where the first type of content addressable memory cells are coupled to one of the at least two matchline segments and the second type of content addressable memory cells are coupled to the other of the at least two matchline segments.

In a third aspect, the present invention provides a hybrid content addressable memory array having a first type of content addressable memory cells coupled to common searchlines, and a second type of content addressable memory cells coupled to the common searchlines. The first type of content addressable memory cells can include binary content addressable memory cells and the second type of content addressable memory cells can include ternary content addressable memory cells, where the content addressable memory cells can be SRAM based.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a content addressable memory array architecture that optimizes storage of binary-only and ternary data without additional circuit overhead. Furthermore, the embodiments of the present invention benefit from reduced power consumption and improved performance as a result of the optimized storage scheme for binary-only and ternary data.

As standardization of formats for network data packets develop, specific fields of the data packets can become constrained by rules of the standard. For example, header fields of data packets must not exceed a predetermined number of bits in length, where each bit position of the header field must be able to store one of three states. As previously mentioned, the three states in the CAM context include logic "1", logic "0" and "don't care" states. Other fields of the data packets, such as the data portion, are simply restricted to binary values. As most CAM devices use only ternary CAM cells, an in particular ternary SCAM cells, significant silicon area can be saved if ternary CAM cells used only for binary storage can be replaced with smaller binary CAM cells.

According to the embodiments of the present invention, a CAM device memory array is subdivided into at least two different portions, where each portion uses only one particular type of CAM cell, and each portion is dedicated to storing a particular type of data.

Figure 6:
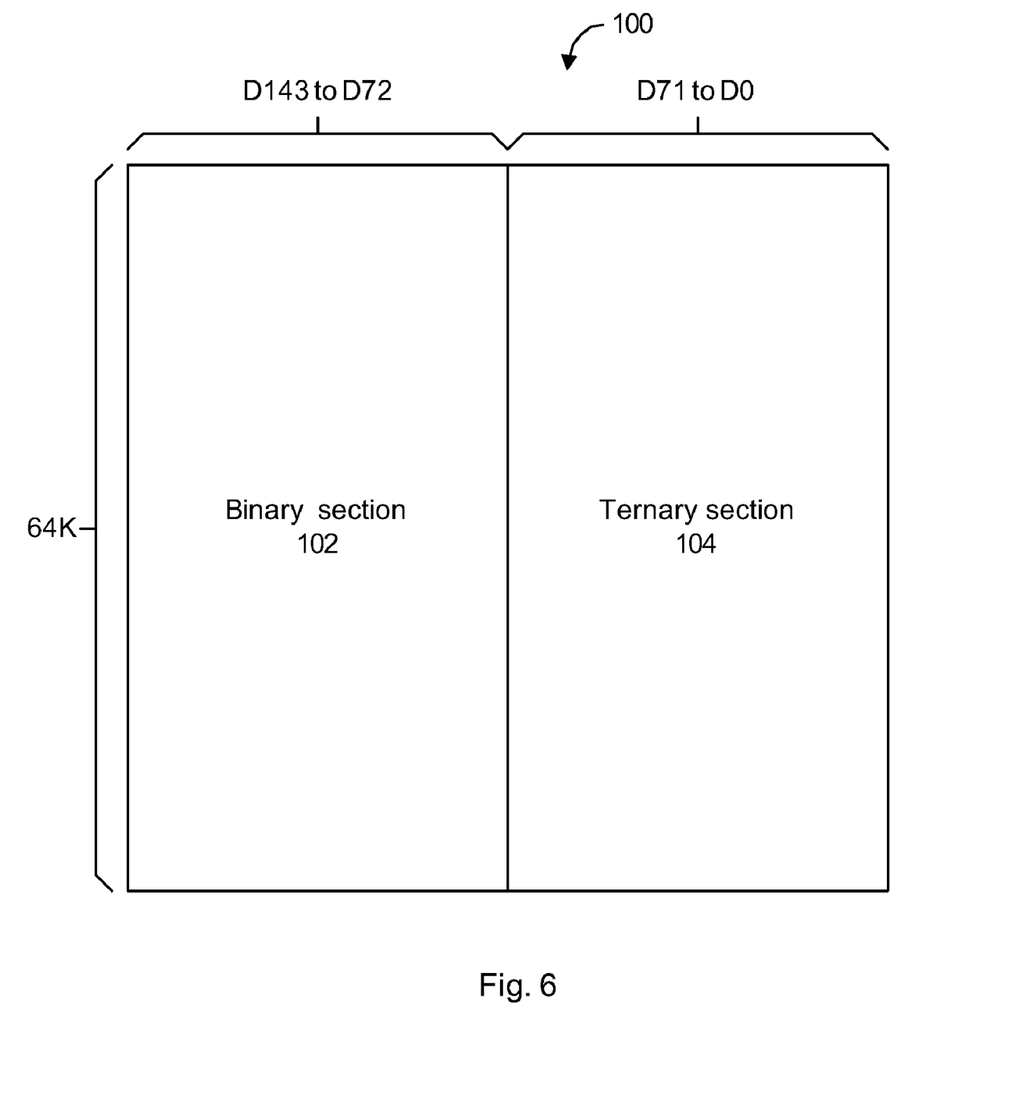
FIG. 6 is a hybrid CAM device memory array architecture according to an embodiment of the present invention.

FIG. 6 is a schematic illustrating a CAM device memory array 100 according to a first embodiment of the present invention that stores each word of data in two different types of CAM cells. In the presently described embodiment, CAM device memory array 100 is subdivided into a binary CAM cell section 102 and a ternary CAM cell section 104, where the CAM cells are disposed in rows and columns, where each row of CAM cells forms a word of data. Hence, each wordline and matchline is coupled to CAM cells in the binary section 102 and CAM cells in the ternary section 104. In this particular example, ternary section 104 stores bit positions D0 to D71 of each word, and binary section 102 stores bit positions D72 to D143 of each word. However, the bit length of each section is not limited to the configuration shown in FIG. 6. Therefore, since half of the CAM device memory array 100 consists of binary CAM cells, such as binary SCAM cells, the overall memory array size is significantly reduced over an equivalent density memory array consisting exclusively of ternary SCAM cells. Although CAM device memory array 100 is 144 bits wide and 64K rows long, a memory array of any dimension can be partitioned into a binary section and ternary section according to the embodiment of the present invention.

Figure 7:
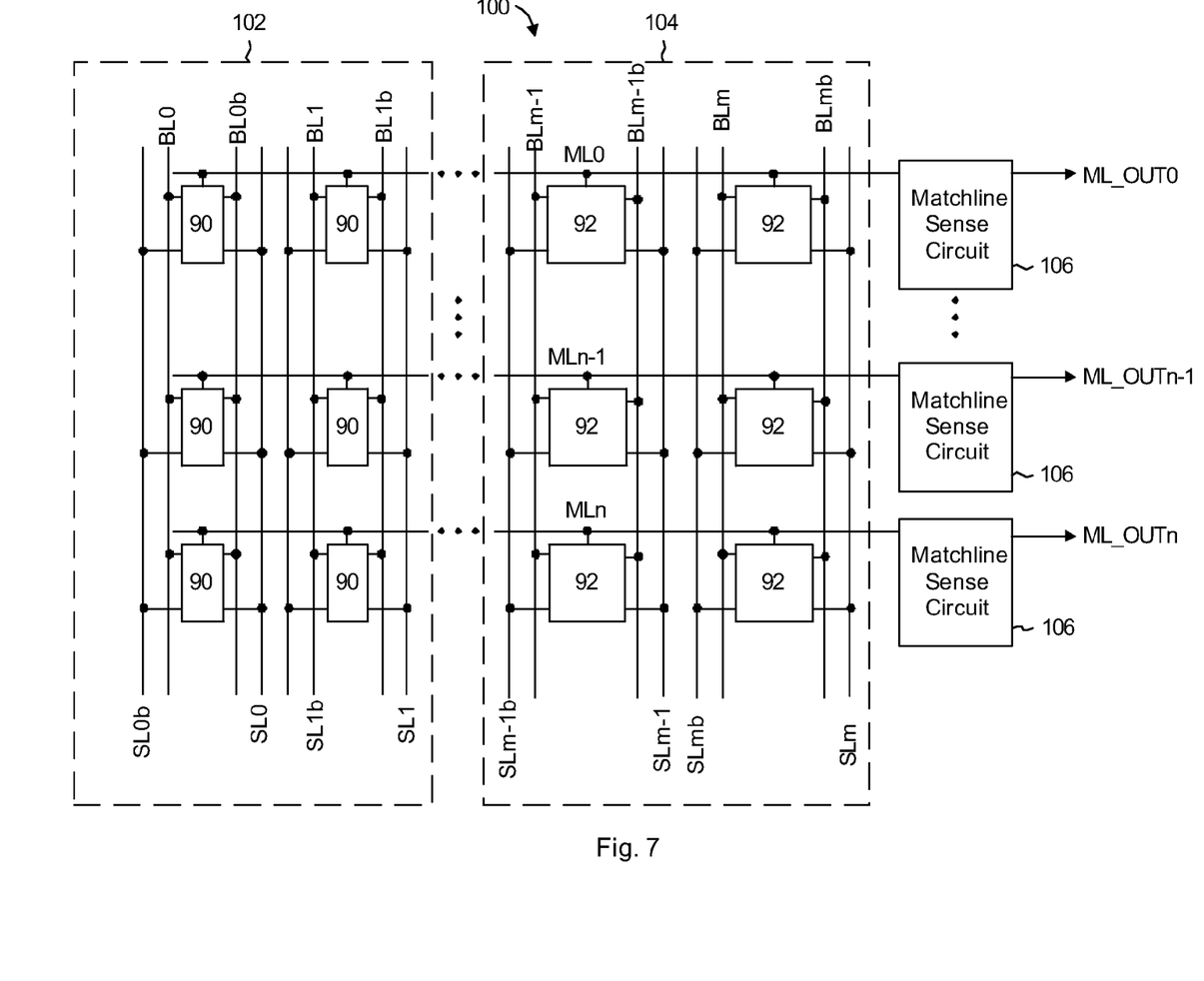
FIG. 7 is a circuit schematic of the hybrid CAM device memory array of FIG. 6.

FIG. 7 is a schematic showing the details of the CAM device memory array 100 illustrated in FIG. 6. Matchlines ML0 to MLn extend horizontally between the binary section 102 and the ternary section 104, and are each coupled to a matchline sense circuit 106 for sensing a respective voltage level during a search and compare operation. As shown in FIG. 7, the content addressable memory cells of binary section 102 and ternary section 104 are electrically coupled to each other via the common matchlines. Wordlines and tail lines are not shown to simplify the schematic, but those of skill in the art will understand that they are required for proper operation. Each matchline sense circuit 106 provides a matchline output ML_OUT representing a match or mismatch condition of its corresponding matchline. Each matchline is coupled to binary CAM cells 90 in binary section 102 and ternary CAM cells 92 in ternary section 104. It is noted that binary CAM cell 90 can be implemented with the circuit configuration of binary SCAM cell 80, and ternary CAM cell 92 can be implemented with the circuit configuration of either ternary SCAM cells 40 or 70 shown in FIGS. 3 and 4 respectively. It should be apparent to those of skill in the art that binary CAM cells 90 in binary section 102 minimizes silicon area consumption since each binary CAM cell 90 uses fewer transistors than each ternary CAM cell 92. Therefore, CAM device memory array 100 maximizes silicon area efficiency because smaller sized binary CAM cells are used to store data that will only be binary in format. It is noted that binary CAM cells 90 can have a layout optimized to minimize column pitch. Hence silicon area along the row direction can be further conserved.

Advantages of the present embodiment are as follows. The reduced row length of each matchline translates into reduced capacitance thereof. Therefore, the performance of each matchline is enhanced while overall power consumption is reduced.

While the embodiments of the present invention shown in FIGS. 6 and 7 partitions the CAM device memory array by columns, the memory array can be partitioned by rows according to an alternate embodiment of the present invention.

Figure 8:
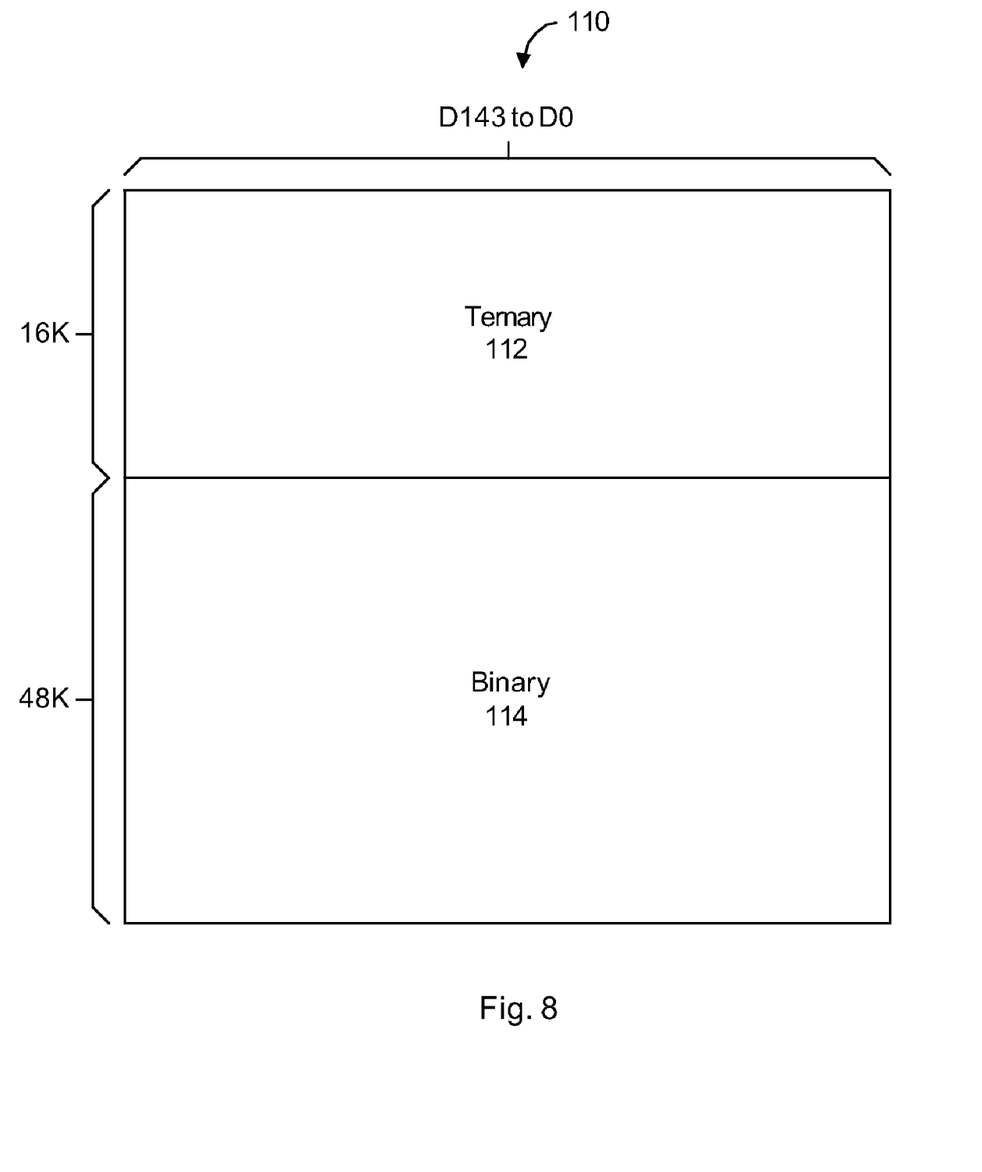
FIG. 8 is a hybrid CAM device memory array architecture according to another embodiment of the present invention; and, FIG. 9 is a circuit schematic of the hybrid CAM device memory array of FIG. 8, and, FIG. 10 is a schematic of a DRAM based ternary CAM cell.

FIG. 8 is a schematic illustrating a CAM device memory array 110 according to a second embodiment of the present invention, with the memory array partitioned into different portions by rows. It is noted that for the purposes of illustrating the present embodiment, CAM device memory array 110 has the same number of rows and columns as CAM device memory array 100 shown in FIG. 6. In the presently described embodiment, CAM device memory array 110 is subdivided into a ternary CAM cell section 112 and a binary CAM cell section 114, where the CAM cells are disposed in rows and columns, where each row of CAM cells forms a word of data. As shown in FIG. 8, ternary CAM cell section 112 occupies 16K rows while binary CAM cell section 114 occupies 48K rows. As will be shown in FIG. 9, each row includes the same type of CAM cell.

Figure 9:
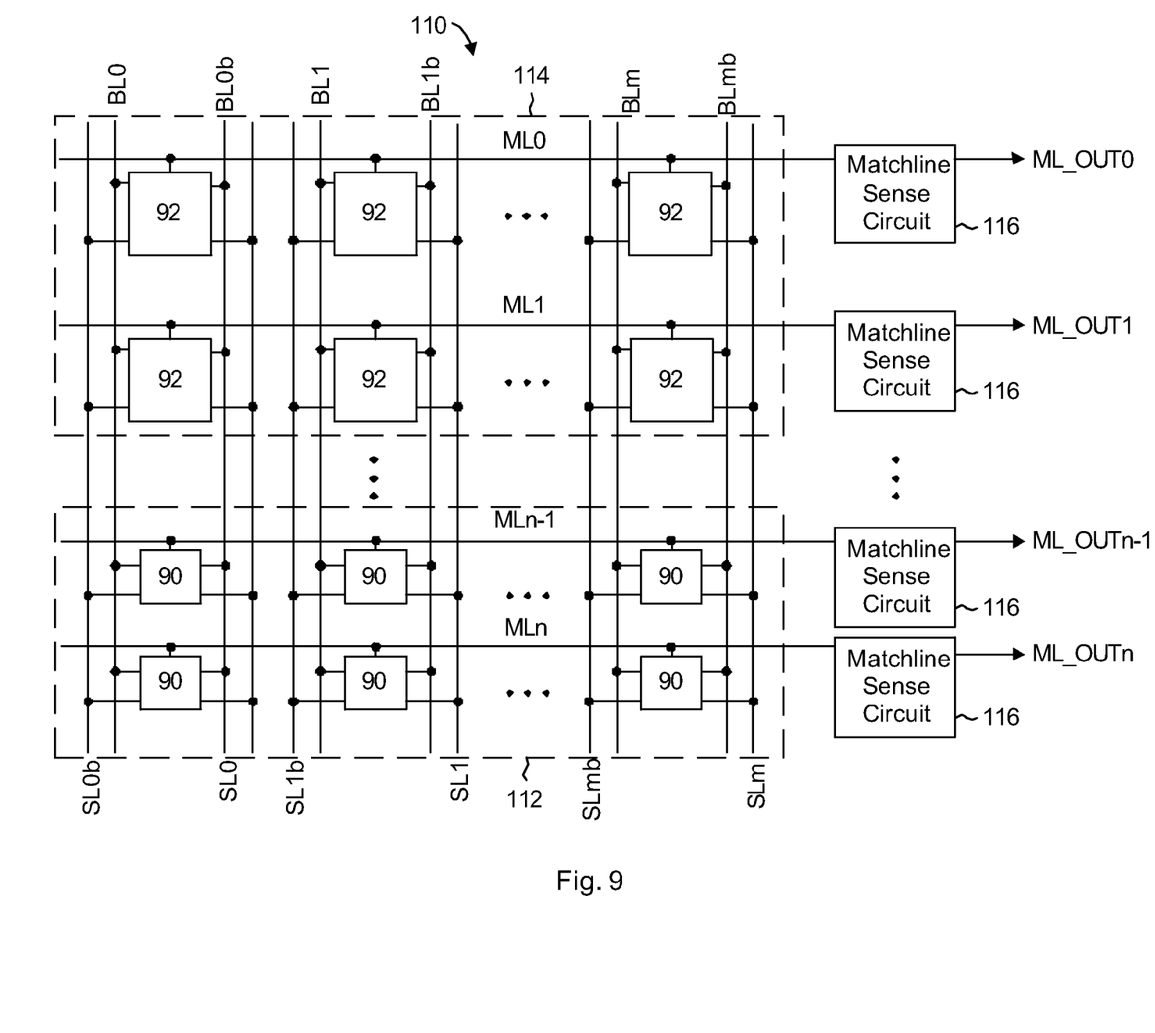

FIG. 9 is a schematic showing the details of the CAM device memory array 110 illustrated in FIG. 8. Matchlines ML0 and ML1 are part of the ternary CAM section 114, and are each coupled to ternary CAM cells 92 and a respective matchline sense circuit 116. Each matchline sense circuit 116 is analogous to matchline sense circuit 106 of FIG. 7, therefore further description of its operation is not necessary. Matchlines MLn-1 and MLn are part of the binary CAM section 112, and are each coupled to binary CAM cells 90 and a respective matchline sense circuit 116. As in FIG. 7, word-lines and tail lines are not shown to simplify the schematic, and the same binary CAM cells 90 and ternary CAM cells 92 can be used. It is noted that each pair of complementary searchlines and bitlines extend vertically between both the binary CAM section 112 and the ternary CAM section 114 such that the ternary CAM cells 92 and binary CAM cells 90 coupled to the same bitline and searchline form one column of CAM cells. Therefore, the content addressable memory cells of binary section 112 and ternary section 114 are electrically coupled to each other via the common bitlines and searchlines. For example, ternary CAM cells 92 and binary CAM cells 90 coupled to SL0b and BL0 are part of the same column of CAM cells. In this particular embodiment, binary CAM cells 90 have been optimized in layout to minimize its footprint along the bitline direction, hence the overall area occupied by CAM device memory array 110 can be minimized along the bitline direction since the pitch of each row of binary CAM cells 90 in the binary CAM section 112 can be made smaller than the pitch of each row of ternary CAM cells 92 in ternary CAM section 114. Therefore, an advantage resulting from the reduced bitline and searchline length is the reduced corresponding capacitance. Therefore, bitline and searchline drive circuit performance can be improved while reducing overall power consumption.

While the embodiments of the present invention have shown the CAM device memory array partitioned into two memory portions, the memory array can be partitioned into any number of memory portions to suit the particular application.

The operation of CAM device memory arrays 100 and 110 according to the embodiments of the present invention, will be analogous to the operation of CAM array 25. More specifically, once search data has been driven onto the searchlines, each CAM cell 90/92 compares its stored data against the searchline data to affect the matchline if a mismatch condition exists.

In the embodiment of the invention shown in FIG. 9, the system may execute a search for binary data stored only in binary section 112, or for ternary data stored in ternary section 114. Although the searchlines are coupled to both the binary section 112 and ternary section 114, the system will have knowledge of those physical rows in each section. More specifically, the results provided by the matchline sense circuits 116 corresponding to results that are undesired can be masked out. For example, this can be done by disabling the matchline sense circuits 116 that correspond to either the binary section 112 during a ternary data search, or the ternary section 114 during a binary data search.

According to another embodiment of the present invention, the CAM device memory array 100 can have segmented matchlines, where each matchline segment of the same row is coupled to different types of CAM cells. Accordingly, each matchline segment of the same row belong to the same logical matchline. Matchline segmentation is disclosed and taught in commonly owned U.S. Pat. No. 6,584,003, the contents of which are incorporated herein by reference, as a technique to reduce power consumption in a CAM device memory array. For example, a first matchline segment of a row of CAM cells can be coupled only to binary CAM cells 90, and a second matchline segment of the row of CAM cells can be coupled only to ternary CAM cells 92. Alternatively, each matchline segment can be coupled to groups of binary CAM cells 90 and ternary CAM cells 92. Those of skill in the art will appreciate that each row can be configured to include any number of matchline segments.

While the previous embodiments of the present invention shown in FIGS. 7 and 9 show the CAM device memory array 100 as having two different CAM memory cell sections, additional CAM memory cell sections can be included. For example, CAM device memory array 100 can include several CAM memory cell sections interleaved with each other, where each section can include any number of rows or columns of CAM memory cells. Hence, the CAM device memory array 100 can be seen as including two logical CAM memory cell blocks having rows or columns, or small groups of rows or columns, interleaved with other.

An alternate embodiment where one or more ternary rows of CAM memory cells is interleaved with one or more binary rows of CAM memory cells can be used in very wide word applications where a word spans more than one physical row of CAM memory cells. In one such an embodiment, each row of ternary CAM cells can be followed by three rows of binary CAM cells. Descriptions of wide word applications are available in commonly owned U.S. Pat. No. 6,708,250 and commonly owned U.S. patent application Ser. No. 10/357,270.

In a further alternate embodiment of the invention shown in FIGS. 6 and 7, the ternary section 104 can include another section of cells, consisting of columns of configurable ternary-binary CAM cells adjacent to the binary section 102 so that the width of ternary section 104 can be dynamically configurable. Alternatively, the entire ternary section 104 can consist of configurable ternary-binary CAM cells. Examples of configurable ternary-binary CAM cells are shown in U.S. Pat. Nos. 6,108,227 and 6,362,992. Persons of skill in the art will understand how to incorporate such cells into the embodiments of the present invention. Therefore, significant silicon area savings can be realized by employing the previously described embodiments of the present invention. Preferably, ternary CAM cell sections of the CAM device memory array include ternary SCAM cells while binary CAM cell sections include binary SCAM cells, to maximize silicon area savings.

While binary and ternary SCAM cells are preferably used in the binary and ternary sections of the CAM device memory array, DRAM based binary and ternary CAM cells, referred to as a ternary or binary DCAM cells from this point forward, can be used instead.

Figure 10:
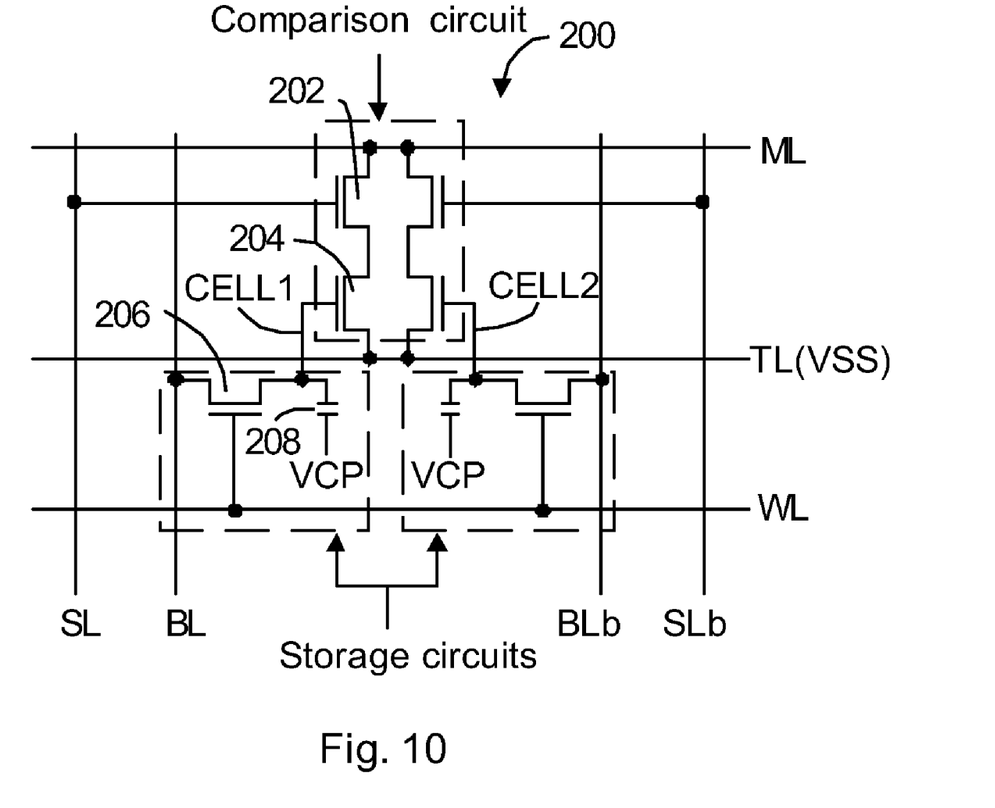

FIG. 10 shows a typical ternary DCAM cell 200 as described in Canadian Patent Application No. 2,266,062, filed Mar. 31, 1999, the contents of which are incorporated herein by reference. DCAM cell 200 has a comparison circuit that includes an n-channel search transistor 202 connected in series with an n-channel compare transistor 204 between a matchline ML and a tail line TL. A search line SL is connected to the gate of search transistor 202. The storage circuit includes an n-channel access transistor 206 having a gate connected to a wordline WL and connected in series with capacitor 208 between bitline BL and a cell plate voltage potential VCP. Charge storage node CELL1 is connected to the gate of compare transistor 204 to turn on transistor 204 if there is charge stored on capacitor 208 i.e. if CELL1 is logic "1". The remaining transistors and capacitor replicate transistors 202, 204, 206 and capacitor 208 for the other half of the ternary data bit, and are connected to corresponding lines SLb and BLb and are provided to support ternary data storage. Further description of the ternary DCAM cell 200 is detailed in the aforementioned reference. It is noted that a binary DCAM version of the ternary DCAM cell 200 is identical to ternary DCAM cell 200, since complementary data states of a single bit of data are necessary for executing a binary search and compare operation. Therefore, ternary DCAM cell 200 can store either binary or ternary data.

Therefore, according to another embodiment of the present invention, CAM device memory arrays 100 and 110 can include ternary and binary DCAM cells in their binary and ternary sections respectively. More specifically, DCAM cells 200 in the ternary section stores ternary data while DCAM cells 200 in the binary section stores binary data. Control logic therefore determines the particular columns of DCAM cells 200 that should have binary data or ternary data written to them. The control logic also determines the appropriate type of search, ie. binary or ternary search, to be applied to specific columns.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A content addressable memory device comprising:
   rows of first matchlines precharged to a voltage level corresponding to a miss condition;
   ternary cells connected in parallel to each of the first matchlines;
   rows of second matchlines precharged to the voltage level corresponding to the miss condition;
   binary cells connected in parallel to each of the second matchlines, the binary cells being smaller in size than the ternary cells and operable simultaneously with the ternary cells;
   searchlines connected to the ternary cells of the rows of first matchlines and to the binary cells of the rows of second matchlines;
   a first plurality of matchline sense amplifiers connected to the rows of first matchlines for detecting one of a first miss condition or a first match condition in response to search data on the searchlines, each of the first plurality of matchline sense amplifiers providing a match output if data stored in the ternary cells of each row matches the search data, each of the first plurality of matchline sense amplifiers being maskable to search the binary cells connected to the second matchlines; and
   a second plurality of matchline sense amplifiers connected to the rows of second matchlines for detecting one of a second miss condition or a second match in response to search data on the searchlines, each of the second plurality of matchline sense amplifiers providing a match output if data stored in the binary cells of each row matches the search data, each of the second plurality of matchline sense amplifiers being maskable to search the ternary cells connected to the first matchlines.

2. The content addressable memory device of claim 1, wherein the rows of first matchlines are interleaved with the rows of second matchlines.

3. The content addressable memory device of claim 1, wherein one row of the rows of first matchlines is adjacent to at least two consecutive rows of second matchlines.

4. The content addressable memory device of claim 1, wherein the ternary cells include static random access memory (SRAM) based ternary content addressable memory cells.

5. The content addressable memory device of claim 1, wherein the binary cells include static random access memory (SRAM) based binary content addressable memory cells.

6. The content addressable memory device of claim 1, wherein the ternary cells include dynamic random access memory (DRAM) based ternary content addressable memory cells.

7. The content addressable memory device of claim 1, wherein the binary cells include dynamic random access memory (DRAM) based binary content addressable memory cells.

8. The content addressable memory device of claim 1, wherein the first plurality of matchline sense amplifiers and the second plurality of matchline sense amplifiers are maskable by disabling the first plurality of matchline sense amplifiers and the second plurality of matchline sense amplifiers.

9. A content addressable memory (CAM) device comprising:
   a first matchline row prechargeable to a first voltage level corresponding to a first miss condition;
   a second matchline row prechargeable to a second voltage level corresponding to a second miss condition;

a ternary CAM cell coupled to the first matchline row;

a binary CAM cell coupled to the second matchline row, the binary CAM cell being smaller than the ternary CAM cell and the binary CAM cell being simultaneously operable with the ternary CAM cell; and the ternary CAM cell and the binary CAM cell being coupled to a common bitline and searchline;

a first sense circuit coupled to the first matchline row for detecting one of the first miss condition or a first match condition on the first matchline row, the first sense circuit being maskable to search the binary CAM cell connected to the second matchline row; and a second sense circuit coupled to the second matchline row for detecting one of the second miss condition or a second match condition on the second matchline row, the second sense circuit being maskable to search the ternary CAM cell connected to the first matchline row.

10. The CAM device as claimed in claim 9, wherein the ternary CAM cell comprises a static random access memory (SRAM) based ternary CAM cell.

11. The CAM device as claimed in claim 9, wherein the binary CAM cell comprises a static random access memory (SRAM) based binary CAM cell.

12. The CAM device as claimed in claim 9, wherein the ternary CAM cell comprises a dynamic random access memory (DRAM) based ternary CAM cell.

13. The CAM device as claimed in claim 9, wherein the first voltage level and the second voltage level are substantially the same.

14. The CAM device as claimed in claim 9, wherein the first match condition and the second match condition correspond to substantially a same voltage of the first matchline and the second matchline.

15. The content addressable memory device of claim 9, wherein the first sense circuit and the second sense circuit are maskable by disabling the first sense circuit and the second sense circuit.

* * * * *